United States Patent
Lin et al.

(10) Patent No.: US 9,825,046 B2
(45) Date of Patent: Nov. 21, 2017

(54) FLASH MEMORY DEVICE HAVING HIGH COUPLING RATIO

(71) Applicant: TAIWAN SEMICONDUCTOR MANUFACTURING CO., LTD., Hsinchu (TW)

(72) Inventors: Yu-Chu Lin, Tainan (TW); Hung-Che Liao, Tainan (TW); Kun-Tsang Chuang, Miaoli County (TW); Shih-Lu Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/988,511

(22) Filed: Jan. 5, 2016

(65) Prior Publication Data

US 2017/0194336 A1 Jul. 6, 2017

(51) Int. Cl.
*H01L 27/11521* (2017.01)
*H01L 29/788* (2006.01)
*H01L 29/423* (2006.01)
*H01L 29/49* (2006.01)
*H01L 29/06* (2006.01)

(52) U.S. Cl.
CPC .... *H01L 27/11521* (2013.01); *H01L 29/0649* (2013.01); *H01L 29/42324* (2013.01); *H01L 29/42372* (2013.01); *H01L 29/4916* (2013.01); *H01L 29/788* (2013.01)

(58) Field of Classification Search
CPC ............... H01L 27/105; H01L 27/115; H01L 21/28114; H01L 21/28273
See application file for complete search history.

(56) References Cited

U.S. PATENT DOCUMENTS

| | | | | |
|---|---|---|---|---|
| 2002/0102793 A1* | 8/2002 | Wu | ........................ | H01L 27/105 438/257 |
| 2002/0117708 A1* | 8/2002 | Nishioka | ............... | H01L 27/105 257/314 |
| 2003/0075756 A1* | 4/2003 | Suzuki | ............. | H01L 21/28273 257/315 |
| 2003/0119256 A1* | 6/2003 | Dong | .................... | H01L 27/115 438/257 |
| 2003/0119259 A1* | 6/2003 | Jeong | ................ | H01L 21/28273 438/257 |
| 2003/0235079 A1* | 12/2003 | Forbes | .................. | H01L 27/115 365/185.17 |
| 2007/0004141 A1* | 1/2007 | Kim | .................. | H01L 21/28114 438/257 |

* cited by examiner

Primary Examiner — Kenneth Parker
Assistant Examiner — Fang-Xing Jiang
(74) Attorney, Agent, or Firm — Maschoff Brennan (57) ABSTRACT

A flash memory cell structure includes a semiconductor substrate, a pad dielectric layer, a floating gate, a control gate, and a blocking layer. The pad dielectric layer is disposed on the semiconductor substrate. The floating gate is disposed over the pad dielectric layer, in which the floating gate has a top surface opposite to the pad dielectric layer, and the top surface includes at least one recess formed thereon. The control gate is disposed over the top surface of the floating gate. The blocking layer is disposed between the floating gate and the control gate.

19 Claims, 5 Drawing Sheets

FLASH MEMORY DEVICE HAVING HIGH COUPLING RATIO

BACKGROUND

The power consumption of a flash memory device has become an important issue as the portable electronic device has become increasingly popular in recent years. A conventional flash memory device has a memory array with a great number of memory units (i.e. memory cells). Each of the memory units is formed as a field-effect transistor including a floating gate and a control gate. The floating gate is configured to hold charges, and is fabricated on an oxide layer over an active region of a semiconductor substrate. The floating gate is separated from the source/drain regions in the semiconductor substrate by the oxide layer. Each memory cell may be programmed or electrically charged by injecting electrons into the floating gate from the substrate through the oxide layer. The charges can be removed from the floating gate during an erase operation. The data in each of the memory cells may be judged by the charges accumulated in the floating gate. Important quality indexes of the flash memory include the power consumption and reliability thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to a storage device such as a flash memory device. The flash memory device is programmed by injecting electrons into the memory cells, and therefore the programming performance is relative to voltage applied thereto. While the memory cells may be programmed using relatively lower voltages, it implies the power saving of the flash memory device, and that is an important concern for electronic devices equipped with the flash memory device. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
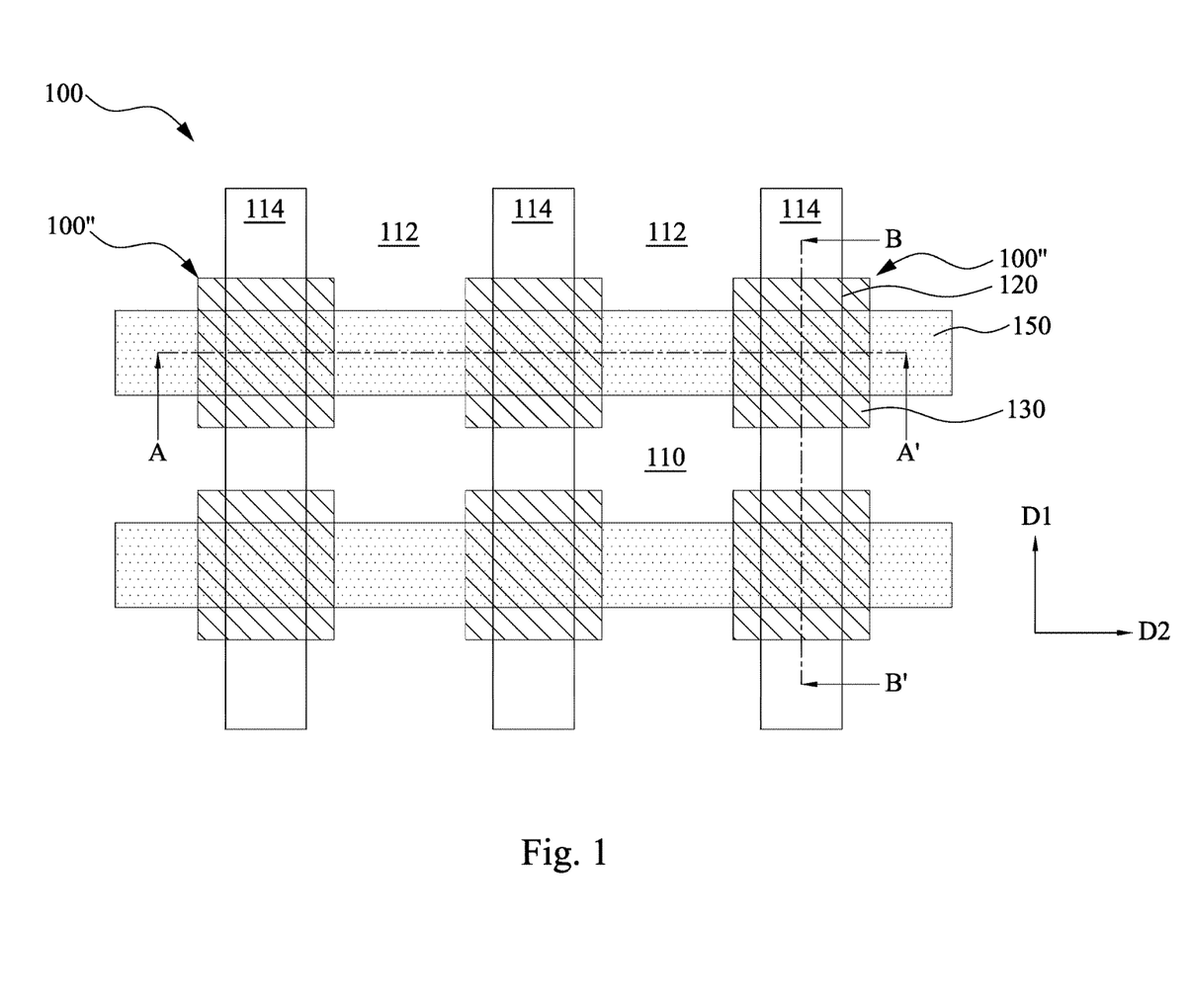
FIG. 1 is a plan view schematically illustrating an integrated circuit structure according to various embodiments of the present disclosure.

FIG. 1 is a plan view schematically illustrating an integrated circuit structure 100 according to various embodiments of the present disclosure. As shown in FIG. 1, the integrated circuit structure 100 includes a semiconductor substrate 110 and a plurality of flash memory cells 100" fabricated thereon. In some embodiments, the semiconductor substrate 110 includes a shallow trench isolation (STI) region 112 which defines an active region 114 in the STI region 112. In some embodiments, the active region 114 includes a stripe pattern in a top view, as shown in FIG. 1, and extends in a direction D1.

The semiconductor substrate 110, for example, may include silicon. In some embodiments, the semiconductor substrate 110 may include other elementary semiconductor such as for example germanium. In yet some embodiments, the semiconductor substrate 110 may include an alloy semiconductor such as for example silicon germanium, silicon germanium carbide, gallium indium phosphide and the like. In yet some embodiments, the semiconductor substrate 110 may include compound semiconductor such as gallium arsenic, silicon carbide, indium phosphide, indium arsenide and the like. Further, the semiconductor substrate 110 may optionally include a semiconductor-on-insulator (SOI) structure.

Figure 2:
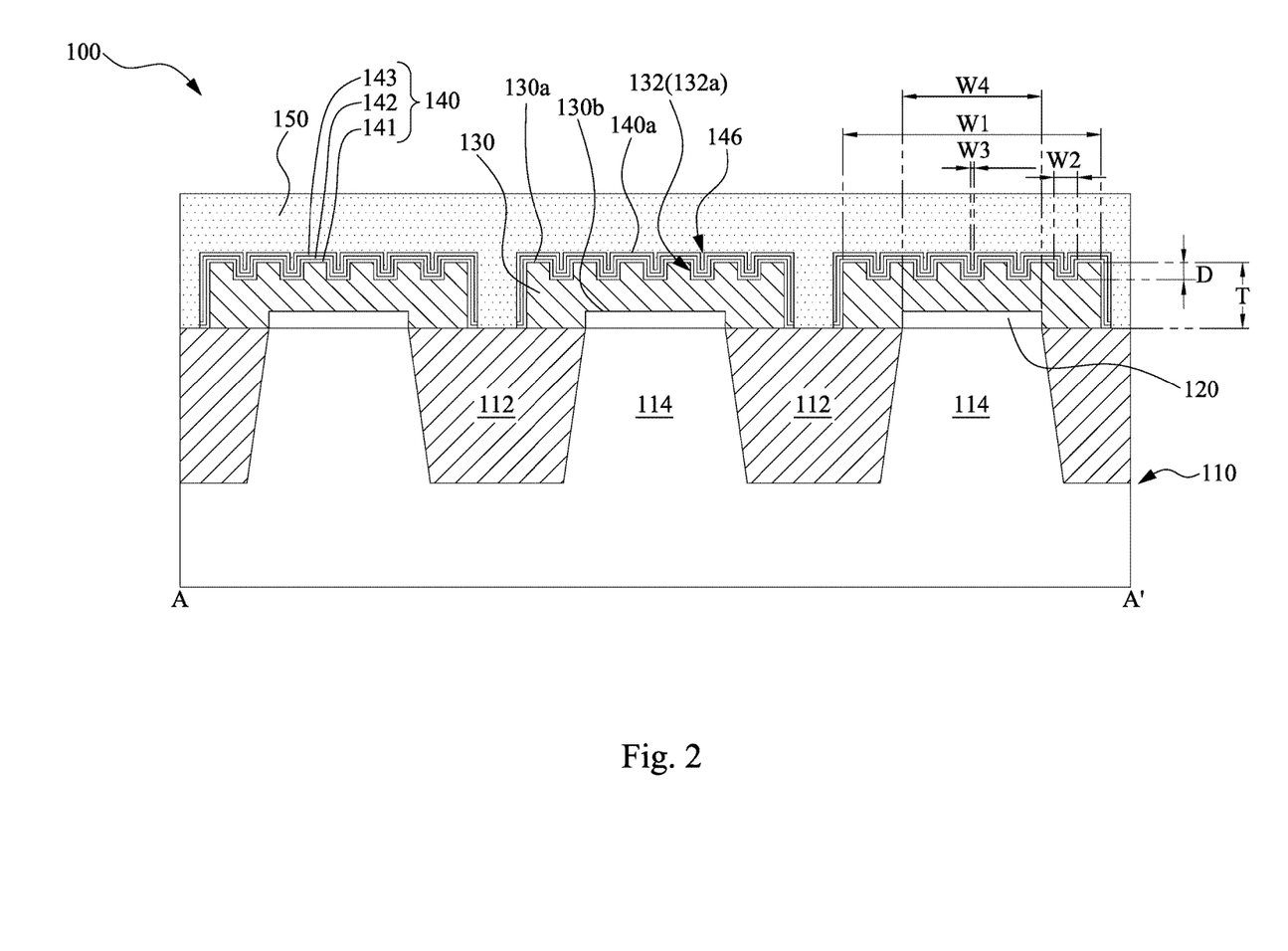
FIG. 2 is a schematic cross-sectional view taken along line A-A' in FIG. 1.
Figure 3:
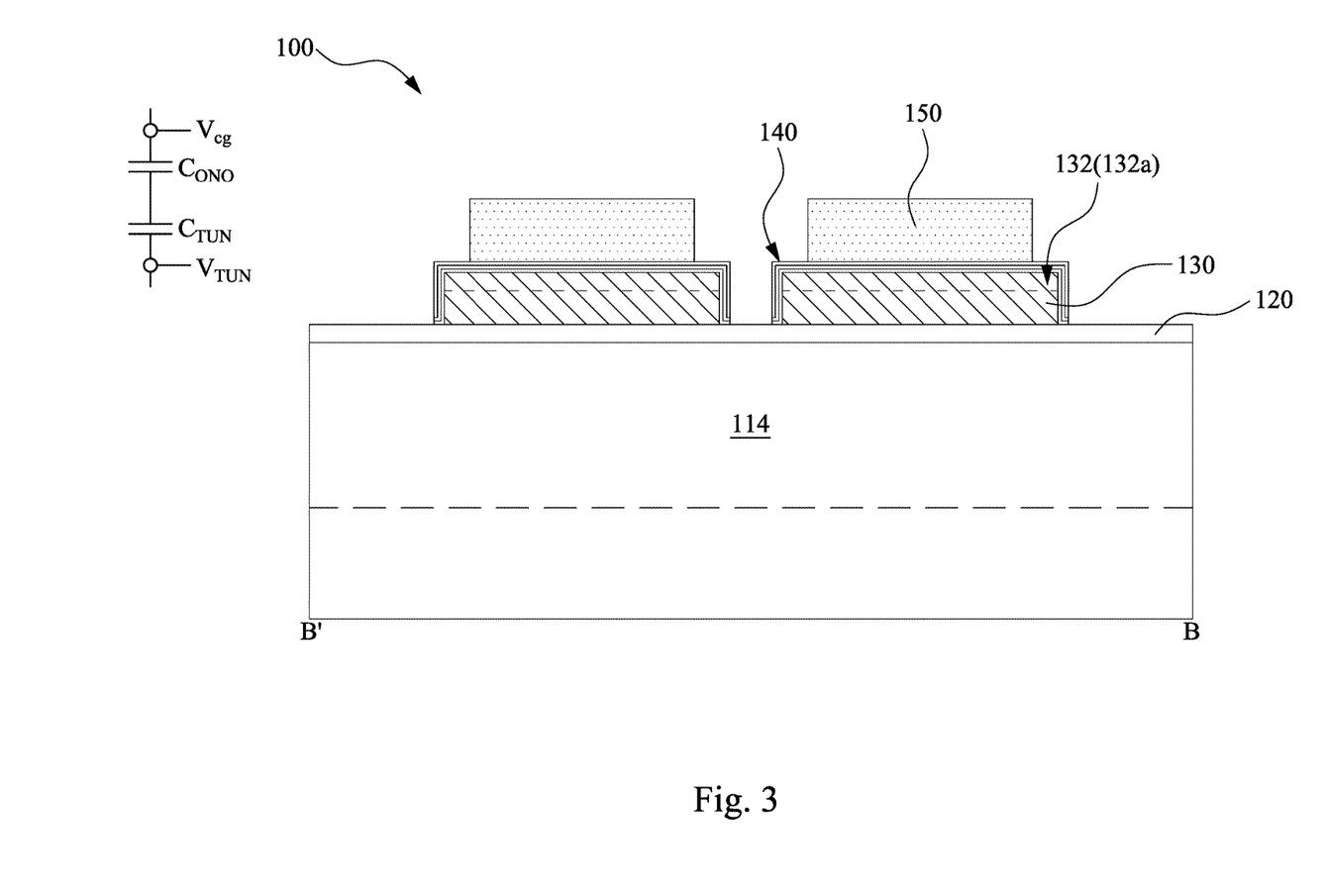
FIG. 3 is a schematic cross-sectional view taken along line B-B' in FIG. 1.

FIG. 2 is a schematic cross-sectional view taken along line A-A' in FIG. 1. FIG. 3 is a schematic cross-sectional view taken along line B-B' in FIG. 1. With reference to FIGS. 1-3, each of the flash memory cells 100" may include a pad dielectric layer 120, a floating gate 130, a blocking layer 140, and a control gate 150.

The pad dielectric layer 120 is disposed on the semiconductor substrate 110. In some embodiments, the pad dielectric layer 120 may be formed of oxide, and hence is also referred to as a tunnel oxide or a floating gate oxide. For example, the pad dielectric layer 120 may be formed by a thermal oxidation process so that the top surface layer of the active region 114 are oxidized to form an oxide material such as for example silicon oxide. In some examples, the pattern of the pad dielectric layer 120 corresponds to the pattern of the active region 114 in a plan view, as illustrated in FIG. 1. In yet some examples, a width W4 of the pad dielectric layer 120 is substantially equals to the width of the active region 114. In yet some embodiments, the pad dielectric layer 120 may include other dielectric materials such as for example silicon nitride, silicon oxynitride, high-K dielectric materials, or low-k dielectric materials, or the like, or a combination thereof. Examples of the high-K dielectric materials include hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfZrO), or the like. Examples of the low-K dielectric materials include phosphosilicate glass (PSG), borophosphosilicate glass (BPSG), fluorinated silicate glass (FSG), silicon carbon material, or the like.

The floating gate 130 is disposed over the pad dielectric layer 120. In various embodiments, the floating gate 130 includes a top surface 130a opposite to the pad dielectric layer 120, and the top surface 130a includes one or more recesses 132 formed thereon.

The recess 132 may be designed in a variety of configurations, shapes, sizes and depths. In some embodiments, the recess 132 includes one or more a trenches 132a. The trench 132a has a depth D that is less than the thickness T of the floating gate 130. Specifically, the depth D may be ranged from about 8% to about 80% of the thickness T of the floating gate 130. In some examples, the depth D may be 8%, 12%, 20%, 25%, 30%, or 40% of the thickness T of the floating gate 130. In yet some examples, the depth D may be 45%, 50%, 60%, 70%, 75%, or 80% of the thickness T of the floating gate 130. In yet some embodiments, the recess 132 may include one or more square recesses, circular recesses, polygonal recesses, or triangular recesses in a top view, or the like or a combination thereof.

In yet some embodiments, the recess 132 includes a depth D and a width W2, and the ratio of the depth D to the width W2 (D/W2) is ranged from about 2 to about 200, specifically about 5 to about 150, more specifically about 10 to about 100. In examples, the ratio of the depth D to the width W2 may be 5, 10, 20, 40, 50, 60, 80 or 100.

In yet some embodiments, the recess 132 may include a number of trenches 132a, and the width W1 of the floating gate 130 is about 3 to 30 folds of the width W2 of each trench 132a. Stated differently, the ratio of the width W2 to the width W1 of the floating gate 130 may be ranged from approximately 0.03 to approximately 0.33. For example, the ratio of the width W2 to the width W1 may be 0.04, 0.06, 0.10, 0.15, 0.20, 0.25, or 0.30.

In yet some embodiments, the recess 132 may include one or more trenches 132a that traverse the top surface 130a of the floating gate 130. Particularly, the trenches 132a may extend in any direction on the top surface 130a of the floating gate 130. In some examples, the trenches 132a may extend in a direction parallel to the extending direction D1 of the active region 114, as illustrated in FIG. 1. In yet some examples, the trenches 132a may extend in a direction D2, which is different from the direction D1.

According to some embodiments of the present disclosure, the floating gate 130 further includes a bottom surface 130b adjacent to the pad dielectric layer 120. In some examples, the bottom surface 130b may be in direct contact with the pad dielectric layer 120. The top surface 130a and the bottom surface 130b are opposite to each other. The surface area of the top surface 130a is greater than that of the bottom surface 130b as one or more recesses 132 are formed on the top surface 130a. In some examples, the surface roughness of the top surface 130a is greater than the surface roughness of the bottom surface 130b.

In some embodiments, the floating gate 130 may include polycrystalline silicon. It is noted that other conductive materials or charge-trapping materials may also be used to form the floating gate 130. The floating gate 130, when formed of polycrystalline silicon, may be implanted with an n-type or a p-type impurity, followed by an annealing process to activate the implanted impurity. In some embodiments, the floating gate 130 has a width W1 that is greater than the width W4 of the pad dielectric layer 120.

In yet some embodiments, the formation of the recess 132 may include forming a patterned masking layer on the floating gate 130, and followed by an etching process. For examples, the patterned masking layer may be a patterned photoresist layer, a patterned hard mask, or the like or a combination thereof. The formation of the patterned masking layer may include typical photolithographic processes, half-ton exposing processes, or self-aligned double patterning (SADP) techniques, or the like, or a combination thereof.

The blocking layer 140 is disposed over the floating gate 130. In some embodiments, the blocking layer 140 may include an Oxide-Nitride-Oxide (ONO) structure having a silicon oxide layer 141, a silicon nitride layer 142 over the silicon oxide layer 141, and an additional silicon oxide layer 143 over the silicon nitride layer 142. In alternative embodiments, the blocking layer 140 may be formed of a single oxide layer, a single nitride layer, a single high-K layer, a single silicon oxynitride layer, or the like, or multiple layers thereof. In some embodiments, the blocking layer 140 covers the entire floating gate 130 so that the blocking layer 140 is further formed on the sidewall of the floating gate 130 as well. However, in yet some embodiments, the blocking layer 140 may only cover the top surface 130a of the floating gate 130, and a floating gate spacer (not shown in FIG. 2) may be disposed at the sidewall of the floating gate 130 so as to enclose the floating gate 130.

In yet some embodiments, the blocking layer 140 may be conformally deposited over the top surface 130a of the floating gate 130, and therefore the blocking layer 140 includes at least one ditch 146 formed on the top surface 140a of the blocking layer 140. The number of the ditches depends on the number of the recesses 132 on the top surface 130a of the floating gate 130. In some examples, the blocking layer 140 is directly formed on the top surface 130a of the floating gate 130, so that the ditch 146 is formed at a position corresponding to the recess 132 (or trench 132a) of the floating gate 130. In particular, the ditch 146 of the blocking layer 140 is substantially aligned with the recess 132 of the floating gate 130. In examples, the ditch 146 has a width W3 that is less than the width W2 of the recess 132. The depth and width of the ditch 146 may be modulated by the deposited thickness of the blocking layer 140 and the width W2 of the recess 132. The blocking layer 140 may be form by any suitable approaches such as for example chemical vapor deposition (CVD) techniques, plasma-enhanced CVD (PECVD) techniques, or physical vapor deposition (PVD) techniques.

The control gate 150 is disposed over the top surface 140a of the blocking layer 140 such that the blocking layer 140 is sandwiched between the floating gate 130 and the control gate 150. For instance, the blocking layer 140 may be interposed and in direct contact with the floating gate 130 and the control gate 150. In some embodiments, as illustrated in FIG. 1, the control gate 150 has a stripe pattern and extends in a direction D2 that is different from the direction D1. In some examples, the direction D2 is perpendicular to the direction D1, and the floating gate 130 is disposed at the intersection of the control gate 150 and the active region 114.

In some embodiments, the control gate 150 may include polycrystalline silicon. It is noted that other conductive materials may also be employed to form control gate 150. The floating gate 130, when formed of polycrystalline silicon, may be implanted with an n-type or a p-type impurity, followed by an annealing process to activate the implanted impurity.

FIG. 3 also illustrates an equivalent-circuit diagram of the blocking layer 140, the floating gate 130 and the pad dielectric layer 120 (e.g., tunnel oxide). It is observed that the voltage ($V_{TUN}$) of the pad dielectric layer 120 may be represented the following equation (1):

$$V_{TUN} \approx (C_{ONO}/C_{TUN}) \times V_{cg} \qquad (1)$$

in which $C_{ONO}$ represents the capacitance of the blocking layer 140; $C_{TUN}$ represents the capacitance between the pad dielectric layer 120 and the blocking layer 140; and $V_{cg}$ represents the voltage applied on the control gate 150.

According to various embodiments, the capacitance ($C_{ONO}$) of the blocking layer is increased as the top-surface area of the floating gate 130 is increased due to the formation of the recesses 132. That is, the coupling ratio $C_{ONO}/C_{TUN}$ is enhanced. Accordingly, the $V_{TUN}$ may be increased when the voltage ($V_{cg}$) applied on the control gate is kept at the same value. This suggests that the reliability of programming the flash memory cell 100" may be improved, or the floating gate 130 may be programmed using a relatively lower voltage.

Figure 4:
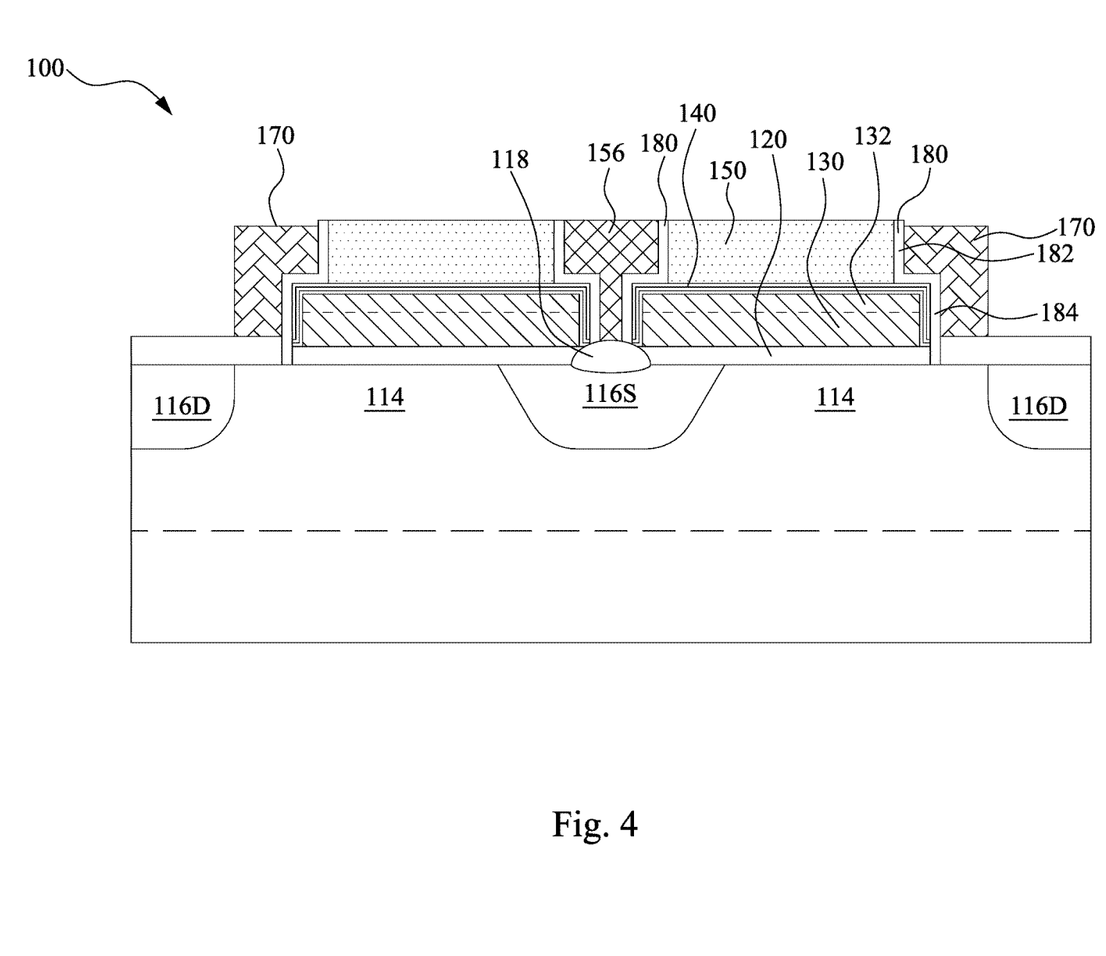
FIG. 4 is a cross-sectional view schematically illustrating an integrated circuit structure according to yet some embodiments of the present disclosure.

FIG. 4 is a cross-sectional view schematically illustrating an integrated circuit structure 100 according to yet some embodiments of the present disclosure. The integrated circuit structure 100 may further include a spacer 180 formed on the sidewall of the stack structure of the control gate 150, the blocking layer 140 and the floating gate 130. The spacer 180 may be formed through any suitable processes. For example, a dielectric layer may be deposited blanketly over the stack structure, and then an anisotropic etching is carried out to remove the horizontal portions of the deposited dielectric layer. In some embodiments, the spacer 180 includes a control gate spacer 182 and a floating gate spacer 184 respectively positioned at sidewalls of the control gate 150 and the floating gate 130.

The integrated circuit structure 100 may further includes a common source region 116S in the active region 114, a dielectric region 118 over the common source region 116S, and an erase gate 156 over the dielectric region 118. The common source region 116S is shared by two neighboring memory cells. In some embodiments, the common source region 116S is a heavily doped n-type or p-type region. The dielectric region 118 may be formed of oxide, and hence sometimes referred to as an Inter-Poly Oxide (IPO). The dielectric region 118 is formed to insulate the overlaying erase gate 156 from the underlying common source region 116S. The erase gate 156 is formed over the dielectric region 118, and positioned between two neighboring memory cells. Further, the spacer 180 is disposed between the erase gate 156 and the control gate 150.

The integrated circuit structure 100 may further includes a word-line 170 and a drain region 116D. The word-line 170 is formed on a side of the spacer 180, and further the word-line 170 and the erase gate 156 are on the opposite sides of the control gate 150. In some embodiments, the word-line 170 includes conductive material such as for example metal, polycrystalline silicon, or the like, or a combination thereof. The drain region 116D is formed at a side of the word-line 170. In addition, the drain region 116D and the common source region 116S are on the opposite sides of the control gate 150. The drain region 116D may be formed by implanting the semiconductor substrate 110 with an n-type or a p-type impurity.

Figure 5:
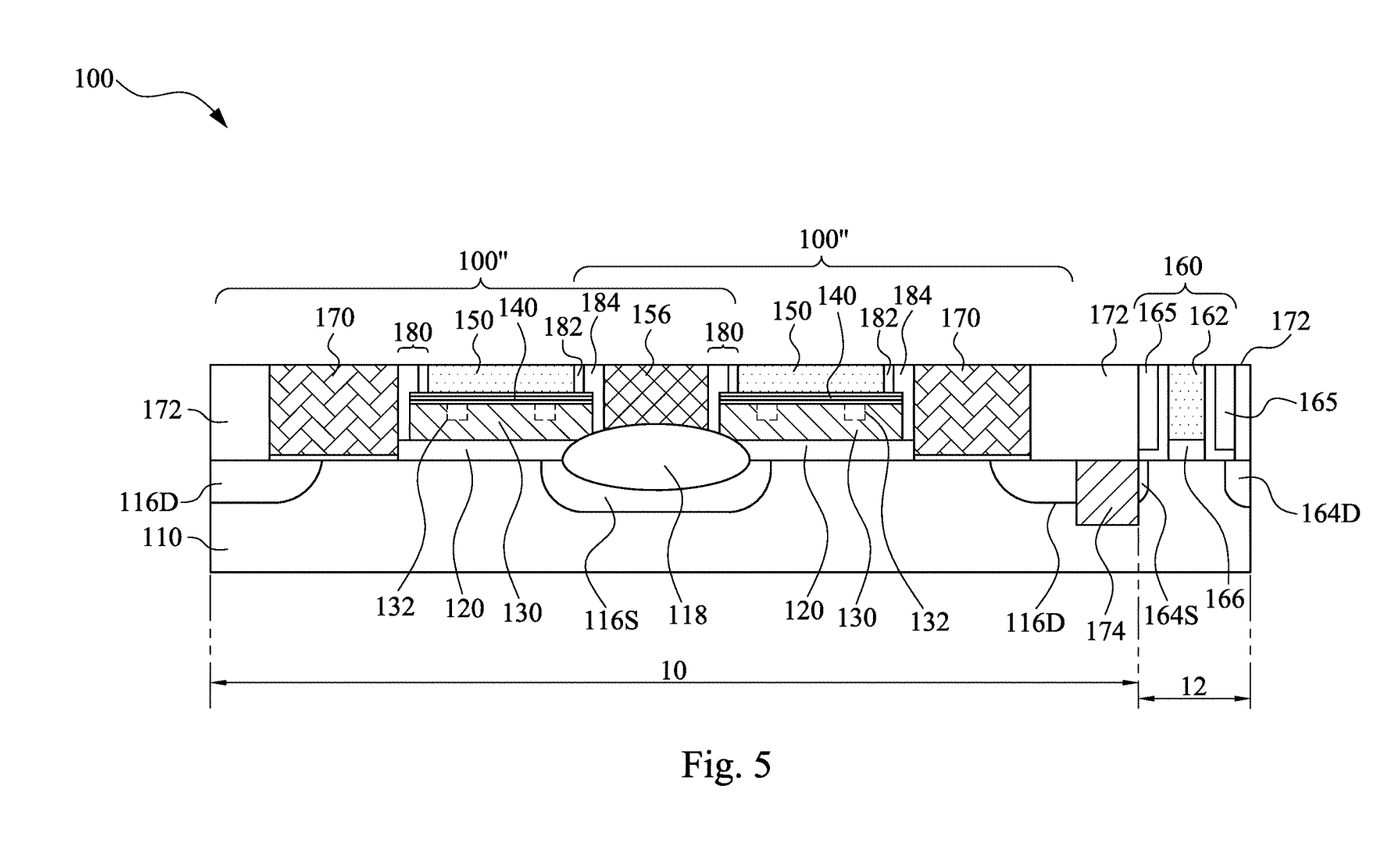
FIG. 5 schematically illustrates a cross-sectional view of an integrated circuit structure including a logic metal-oxide semiconductor (MOS) device and a plurality of flash memory cells, according to yet some embodiments of the present disclosure.

FIG. 5 schematically illustrates a cross-sectional view of an integrated circuit structure 100 including a logic metal-oxide semiconductor (MOS) device 160 and a plurality of flash memory cells 100", according to yet some embodiments of the present disclosure. The flash memory cells 100" are formed in the memory cell region 10, and the logic MOS device 160 is formed in the MOS device region 12. The logic MOS device 160 and the flash memory cells 100" are formed on the same semiconductor substrate 110, and are in the same chip. The logic MOS device 160 may be a high-voltage MOS device, a core MOS device, a Static Random Access Memory (SRAM) device, an Input/Output MOS device, or the like, for example.

The logic MOS device 160 may include a gate electrode 162 and a gate dielectric 166 under the gate electrode 162. In some embodiments, the gate dielectric 166 may include an interfacial oxide layer and a high-K dielectric layer over the interfacial oxide layer. In some examples, the interfacial oxide layer includes silicon oxide, and the high-K dielectric layer includes a high-K material such as for example aluminum oxide, hafnium oxide ($HfO_2$), lanthanum oxide ($La_2O_3$), hafnium silicon oxide (HfSiO), hafnium silicon oxynitride (HfSiON), hafnium tantalum oxide (HfTaO), hafnium titanium oxide (HMO), hafnium zirconium oxide (HfZrO), or the like, or a combination thereof. The gate electrode 162 is disposed over the gate dielectric 166. The gate electrode 162 may include metal-containing material or polycrystalline silicon, or the like, or a combination thereof. In some embodiments, the logic MOS device 160 may further include a conductive barrier layer (not shown in FIG. 5) between the gate electrode 162 and the gate dielectric 166. The conductive barrier layer may include titanium, titanium nitride, tantalum, tantalum nitride, or the like. In some embodiments, the logic MOS device 160 is a PMOS device, and the gate electrode 162 includes a material with a high work function. In alternative embodiments, the logic MOS device 160 is a NMOS device, and the gate electrode 162 includes a material with a low work function. Gate spacers 165 are formed on the opposite sides of the gate electrode 162.

The logic MOS device 160 may further include a source region 164S and a drain region 164D, which are formed in the semiconductor substrate 110. The impurity doped in the source region 164S and drain region 164D depends on the conductive type of the logic MOS device 160. When the logic MOS device 160 is a PMOS device, the source region 164S and drain region 164D are p-type region. When the logic MOS device 160 is an NMOS device, the source region 164S and drain region 164D are n-type region. A shallow trench isolation (STI) structure 174 may be provided in the semiconductor substrate 110 for device isolation.

The flash memory cells 100" are formed in the memory cell region 10. As illustrated in FIG. 5, each of the flash memory cells 100" includes a pad dielectric layer 120, a floating gate 130, a blocking layer 140, and a control gate 150. Additionally, two adjacent flash memory cells 100" share a common source region 116S, a dielectric region 118 (e.g. Inter-poly-oxide) and an erase gate 156 according to some embodiments of the present disclosure.

The pad dielectric layer 120 is disposed on the semiconductor substrate 110. In some embodiments, the pad dielectric layer 120 may be formed of oxide, and hence is also referred to as a tunnel oxide or a floating gate oxide. In some embodiments, the material for forming the pad dielectric layer 120 is the same as the material of the gate dielectric 166.

The floating gate 130 is disposed over the pad dielectric layer 120. In various embodiments, the floating gate 130 includes one or more recesses 132 formed thereon. The recesses 132 may be designed in a variety of configurations, shapes, sizes and depths. For example, the recesses 132 may include one or more trenches, and/or square recesses, circular recesses, polygonal recesses, or triangular recesses, or the like. In some embodiments, each of the recesses 132 has a depth that is less than the thickness of the floating gate 130. Specifically, the depth of each recess 132 may be ranged from about 8% to about 80% of the thickness of the floating gate 130. In yet some embodiments, each of the recesses 132 has a depth and a width, and the ratio of the depth to the width is ranged from about 2 to about 200, specifically about 5 to about 150, more specifically about 10 to about 100.

The blocking layer 140 is disposed over the floating gate 130. In some embodiments, the blocking layer 140 includes a stack structure of Oxide-Nitride-Oxide (ONO). The blocking layer 140 includes one or more ditches formed thereon. The ditches of the blocking layer are formed at a position corresponding to the recesses of the floating gate 130. For example, the blocking layer 140 may be conformally deposited over the top surface of the floating gate 130. In some embodiments, the blocking layer 140 is formed on the top surface of the floating gate 130 only, and the sidewall of the floating gate 130 is not covered by the blocking layer 140.

The control gate 150 is disposed over the blocking layer 140. In some embodiments, the material for forming the control gate 150 is the same as the material of forming the gate electrode 162 in the logic MOS device 160. For example, the control gate 150 and the gate electrode 162 may include polycrystalline silicon. In yet some embodiments, however, the control gate 150 and the gate electrode 162 may include a metal-containing material. In some examples, the logic MOS device 160 is a PMOS device, and the control gate 150 and the gate electrode 162 have a high work function, which is higher than about 4.8 eV, for example. Illustrative examples of the materials with the high work functions include Ni, Pt, WN, Ru, MO, and the like. In yet some examples, the logic MOS device 160 is a NMOS device, and the control gate 150 and the gate electrode 162 have a low work function, which is higher than about 4.2 eV, for example. Illustrative examples of the materials with the low work functions include Ta, Ti, Nb, Al, TiSi, and the like.

A spacer 180 may be provided in the flash memory cells 100" according to some embodiments of the present disclosure. The spacer 180 may include a control gate spacer 182 and a floating gate spacer 184. The control gate spacer 182 is formed on the sidewalls of the control gate 150, standing on the blocking layer 140. The top surface of the control gate spacer 182 is level with the top surface of the control gate 150. Further, the floating gate spacer 184 is formed on the sidewalls of the floating gate 130, and further extends upwards to a position level with the top surface of the control gate spacer 182. In examples, the control gate spacer 182 and floating gate spacer 184 may be formed of silicon oxide, silicon nitride, silicon oxynitride, or the like, or a combination thereof.

A word-line 170 may be provided in the flash memory cells 100" according to some embodiments. The word-line 170 is disposed at a side of the spacer 180, in which the spacer 180 is interposed between the word-line 170 and each of the floating gate 130 and the control gate 150. In some embodiments, the word-line 170 may include a metal-containing material containing a metal or a metal alloy. In some example, the word-line 170 includes a material identical to the material of the gate electrode 162 in the logic MOS device 160, and the top surface of the word-line 170 is level with the top surface of control gate 150.

The erase gate 156 is disposed over the dielectric region 118 (e.g. Inter-poly-oxide) and the common source region 116S. The erase gate 156 is disposed at a side of the spacer 180, which electrically insulates the floating gate 130 from the erase gate 156. In some embodiments, the erase gate 156 may be formed of a metal-containing material including a metal or a metal alloy.

In some embodiments, the floating gate 130 is formed of polycrystalline silicon, whereas the control gate 150, the erase gate 156, the word-line 170, and the gate electrode 162 are formed of the same metal-containing material. In particular, the "gate-last process" may be employed to replace a poly-silicon gate electrode 162 with a metal gate, and therefore the control gate 150, the erase gate 156 and the word-line 170 may be simultaneously replaced by the same material as the metal gate through the gate-replacement process.

Advantages of various embodiments of the present disclosure include providing a novel flash memory cell with an enhanced coupling ratio $C_{ONO}/C_{TUN}$. The flash memory cell may be programmed at low voltages, and that implies low power consumption of the flash memory device. In another aspect, the flash memory cell may provide good reliability in the programming operation.

In accordance with one aspect of some embodiments, a flash memory cell structure includes a semiconductor substrate, a pad dielectric layer, a floating gate, a control gate, and a blocking layer. The pad dielectric layer is disposed on the semiconductor substrate. The floating gate is disposed over the pad dielectric layer, in which the floating gate has a top surface opposite to the pad dielectric layer, and the top surface includes at least one recess formed thereon. The control gate is disposed over the top surface of the floating gate. The blocking layer is disposed between the floating gate and the control gate.

In accordance with another aspect of some embodiments, an integrated circuit structure includes a semiconductor substrate and a flash memory cell. The flash memory cell includes a pad dielectric layer, a floating gate, a blocking layer and a control gate. The pad dielectric layer is disposed on the semiconductor substrate. The floating gate is disposed over the pad dielectric layer. The floating gate has a top surface opposite to the pad dielectric layer, and the top surface includes at least one trench formed thereon, and the trench has a depth ranged from about 8% to about 80% of a thickness of the floating gate. The blocking layer is in physical contact with the top surface of the floating gate, and the blocking layer includes a ditch at a position corresponding to the trench. The control gate is disposed over the top surface of the blocking layer.

In accordance with another aspect of some embodiments, an integrated circuit structure includes a semiconductor substrate and a plurality of flash memory cells. Each of the flash memory cells includes a pad dielectric layer, a floating gate, a control gate, and a blocking layer. The pad dielectric layer is disposed on the semiconductor substrate. The floating gate is disposed over the pad dielectric layer. The floating gate has a bottom surface adjacent to the pad dielectric layer and a top surface opposite to the bottom surface, and a surface area of the top surface is greater than a surface area of the bottom surface. The control gate is disposed over the top surface of the floating gate. The blocking layer is disposed between the floating gate and the control gate.

What is claimed is:

1. A flash memory cell structure, comprising:
   a semiconductor substrate;
   a pad dielectric layer disposed on the semiconductor substrate;
   a floating gate disposed over the pad dielectric layer, wherein the floating gate comprises:
      a first edge;
      a second edge opposite to the first edge;
      a bottom surface adjacent to the pad dielectric layer; and
      a top surface opposite to the bottom surface and between the first edge and the second edge, wherein the top surface has a plurality of trenches and each of the trenches extend from the first edge of the floating gate to the second edge of the floating gate;
   a control gate disposed over the top surface of the floating gate; and
   a blocking layer disposed between the floating gate and the control gate.

2. The flash memory cell structure according to claim 1, wherein the blocking layer is conformally formed on the top surface of the floating gate.

3. The flash memory cell structure according to claim 1, wherein the blocking layer comprises a top surface and a plurality of ditches formed thereon, the ditches are aligned with the trenches of the floating gate.

4. The flash memory cell structure according to claim 1, wherein the blocking layer comprises a top surface and a plurality of ditches formed thereon, and a width of each ditch is less than a width of each trench.

5. The flash memory cell structure according to claim 1, wherein the bottom surface is in physical contact with the pad dielectric layer, and a surface roughness of the top surface is greater than a surface roughness of the bottom surface.

6. The flash memory cell structure according to claim 1, wherein each of the trenches has a depth ranging from about 8% to about 80% of a thickness of the floating gate.

7. The flash memory cell structure according to claim 1, wherein each of the trenches has a depth and a width, and a ratio of the depth to the width ranges from about 2 to about 200.

8. The flash memory cell structure according to claim 1, wherein each of the trenches has a width that is about 3% to 33% of a width of the floating gate.

9. The flash memory cell structure according to claim 1, wherein the floating gate comprises polycrystalline silicon.

10. The flash memory cell structure according to claim 1, wherein the control gate comprises polycrystalline silicon.

11. The flash memory cell structure according to claim 1, wherein the control gate comprises a metallic material.

12. The flash memory cell structure according to claim 1, wherein the semiconductor substrate comprises a shallow trench isolation region defining an active region therein, and the active region has a width that is less than a width of the floating gate.

13. The flash memory cell structure according to claim 1, wherein the blocking layer is in physical contact with the floating gate and the control gate.

14. An integrated circuit structure, comprising:
   a semiconductor substrate; and
   a flash memory cell, comprising:
      a pad dielectric layer disposed on the semiconductor substrate;
      a floating gate disposed over the pad dielectric layer, wherein the floating gate comprises:
         a first edge;
         a second edge opposite to the first edge;
         a bottom surface adjacent to the pad dielectric layer; and
         a top surface opposite to the bottom surface and between the first edge and the second edge, wherein the top surface has a plurality of trenches and each of the trenches extends from the first edge of the floating gate to the second edge of the floating gate, and each of the trenches has a depth ranged from about 8% to about 80% of a thickness of the floating gate;
      a blocking layer in physical contact with the top surface of the floating gate, wherein the blocking layer comprises a plurality of ditches, each of the ditches at a position corresponding to one of the trenches; and
      a control gate disposed over the top surface of the blocking layer.

15. The integrated circuit structure according to claim 14, wherein a width of each ditch is less than a width of each trench.

16. The integrated circuit structure according to claim 14, wherein each trench has a depth and a width, and a ratio of the depth to the width ranges from about 5 to about 200.

17. An integrated circuit structure, comprising:
   a semiconductor substrate; and
   a plurality of flash memory cells, each of the flash memory cells comprising:
      a pad dielectric layer disposed on the semiconductor substrate;
      a floating gate disposed over the pad dielectric layer, wherein the floating gate comprises:
         a first edge;
         a second edge opposite to the first edge;
         a bottom surface adjacent to the pad dielectric layer; and
         a top surface opposite to the bottom surface and between the first edge and the second edge, wherein the top surface has a plurality of trenches and each of the trenches extend from the first edge of the floating gate to the second edge of the floating gate;
      a control gate disposed over the top surface of the floating gate; and
      a blocking layer disposed between the floating gate and the control gate.

18. The integrated circuit structure according to claim 17, further comprising a metal oxide semiconductor device having a gate electrode, wherein the gate electrode and the control gate are formed of a same material.

19. The integrated circuit structure according to claim 17, wherein each of the trenches has a depth and a width, and a ratio of the depth to the width ranges from about 5 to about 200, and the depth of each of the trenches ranges from about 8% to about 80% of a thickness of the floating gate.

\* \* \* \* \*